United States Patent [19]

Naimer et al.

[11] 4,380,121
[45] Apr. 19, 1983

[54] ELECTRIC SHAVER

[75] Inventors: Gundolf Naimer; Kurt Hauer, both of Graz, Austria

[73] Assignee: Payer-Lux Elektroprodukte Gesellschaft m.b.H., Graz, Austria

[21] Appl. No.: 249,971

[22] Filed: Apr. 1, 1981

[30] Foreign Application Priority Data

Apr. 3, 1980 [AT] Austria ............................ 1838/80

[51] Int. Cl.³ ............................................. B26B 19/38
[52] U.S. Cl. ........................................ 30/42; 30/90; 200/61.58 R
[58] Field of Search .................... 30/90, 34 R, 42, 43, 30/44; 200/61.58 R, 52 R, DIG. 2

[56] References Cited

U.S. PATENT DOCUMENTS 3,715,540  2/1973  Larson .......................... 200/DIG. 2
3,737,670  6/1973  Larson .......................... 200/DIG. 2
3,793,724  2/1974  Messinger ............................ 30/90 X
4,242,799  1/1981  Kameyama ........................ 30/90 X Primary Examiner—James M. Meister
Attorney, Agent, or Firm—Frost & Jacobs

[57] ABSTRACT

An electric shaver in which the conventional user actuated on-off switch is eliminated, the shaver being automatically actuated when brought into contact with the area of the body to be shaved and deactuated when removed, the shaver being provided with an electronic sensor switch (5) which is electrically connected to a contact plate (K2) on the outside of the casing (1) within the gripping zone and to the shear face (K1) of the shear head 2, the terminals (53, 54) of the sensor switch being connected to the control circuit of an actuating means (RL) for opening and closing the motor circuit.

4 Claims, 3 Drawing Figures

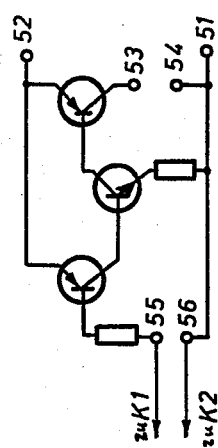
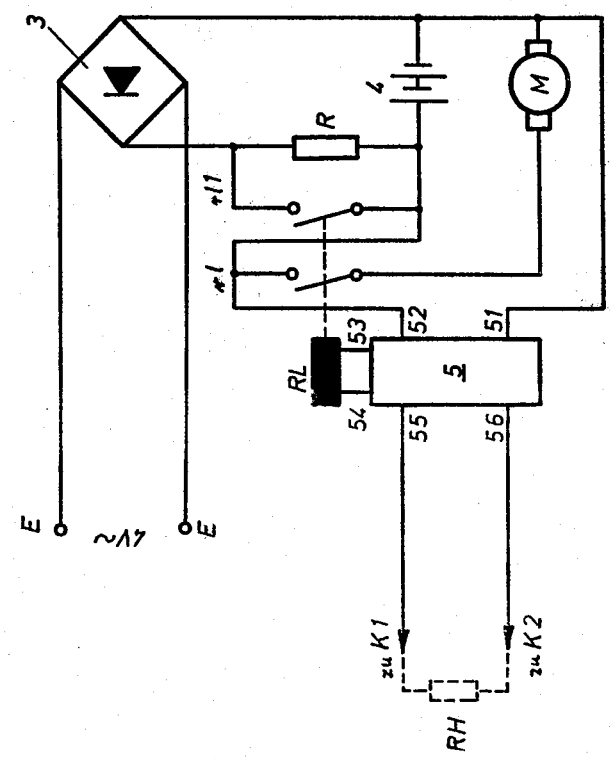
Fig. 3
Fig. 2

ELECTRIC SHAVER

BACKGROUND OF THE INVENTION

The invention relates to an electric shaver having a casing, a shear head and a driving motor for the knife; an on-off switch is provided in the electric circuit of the motor.

Known shavers are provided with purely mechanically actuated switches, mainly slide or push switches which must be actuated by the user for turning the shaver on and off.

SUMMARY OF THE INVENTION

Object of the invention is the improvement comprising a shaver which does not have a switch having to be actuated by the user, but instead switches on automatically when placed by the user onto the zone of the body to be shaved and switches off just as automatically when lifted off this zone. This object is achieved in an electric shaver of the type initially mentioned by providing an electric sensor switch which is electrically connected to a contact plate on the outside of the casing within the gripping zone and to the shear surface with shear head and shear foil, the contact line of the sensor switch being connected to the control circuit of a relay, opto coupler or the like closing or interrupting the motor circuit.

An electric shaver of this construction has the following advantages:

The mechanical switch to be actuated by the user is completely eliminated, which allows the provision of a smooth shaver casing free of openings. The motor of the shaver runs only when the shear face comes into contact with the skin zone to be shaved, i.e. when actual shaving takes place, which results in more shaving operations per battery set or accumulator charge for battery or accumulator shavers. It is further no longer possible to inadvertently store the shaver in a switched-on state, which particularly in the case of accumulator shavers prevents the discharge at sub-normal level which is so detrimental to the accumulator. Aside from the sensor switch, a discharge at sub-normal level is further prevented in the shaver according to the invention by the relay closing or interrupting the motor circuit dropping at about 1.5 V accumulator voltage and thus constantly interrupting the circuit. But even with mains-operated shavers, the energy saving principle is taken into consideration by the embodiment according to the invention. Finally, it is equally comfortable in battery, accumulator and mains-operated shavers that the shaver starts to run when placed onto the body zone to be shaved and stops when lifted off.

According to a further embodiment of the invention, it may be practical to provide a releasing delay for the relay in order to prevent interruption ("spluttering") of the drive motor upon a small decrease of the pressure of the shaver on the spot to be shaved or short duration lifting of the shaver; a comparatively brief releasing delay of a few seconds may suffice for this purpose.

According to a further embodiment of the invention, an accumulator shaver can be provided with an operating contact of the relay parallel in respect of the charging resistance of the accumulator, in order to assure an automatic switch-over from shaver operation—either via accumulator or mains—to charging operation of the accumulator.

DESCRIPTION OF THE DRAWINGS

An embodiment of the invention is explained in detail with reference to the drawing showing an accumulator-operated shaver. In the same manner, the invention is applicable to battery and mains-operated shavers.

FIG. 2 shows the circuit diagram of the shaver according to the invention and

FIG. 3 shows a mode of connection for the sensor switch.

DESCRIPTION OF THE PREFERRED EMBODIMENTS

Figure 1:
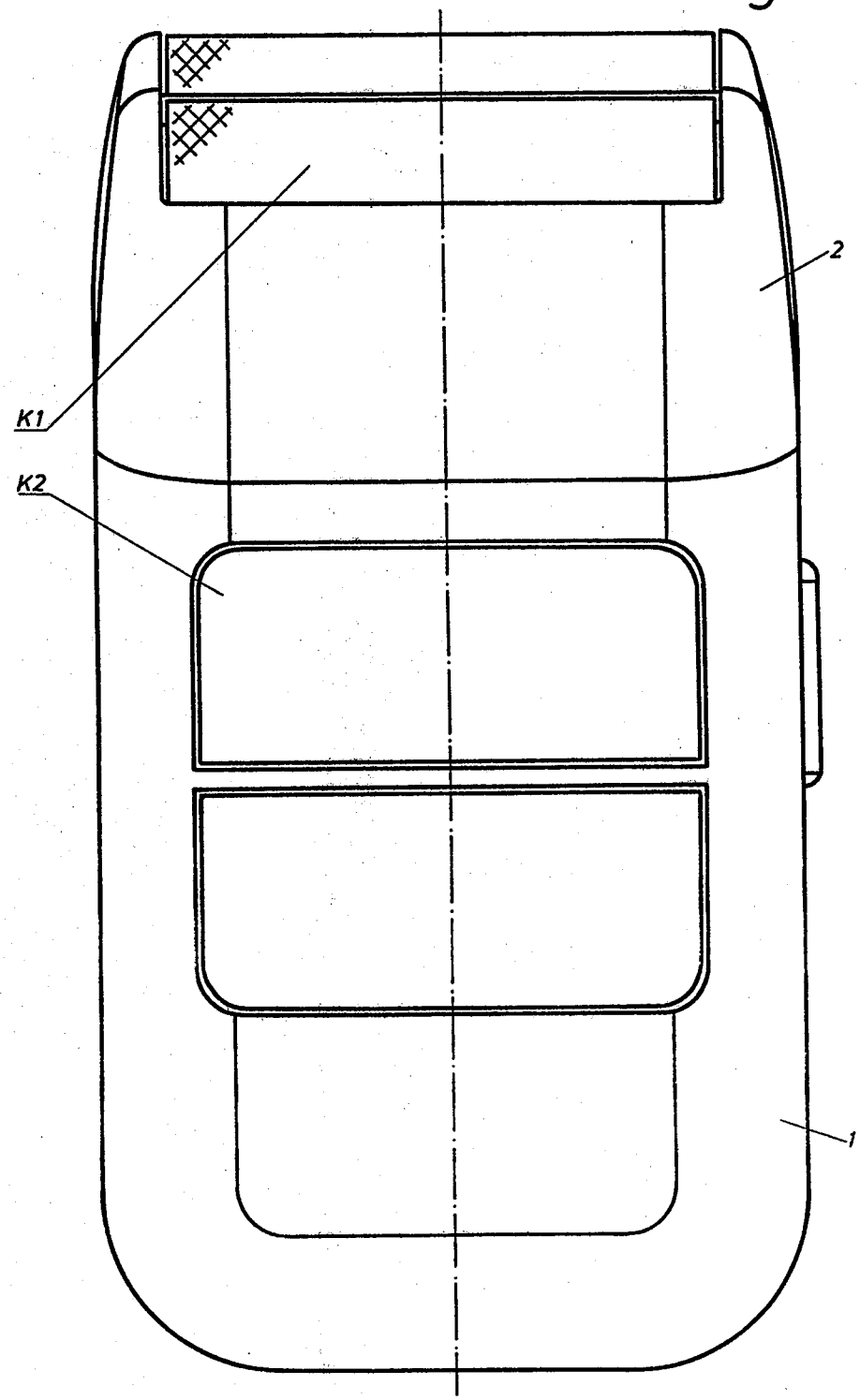
FIG. 1 shows a broadside view of the shaver according to the invention.

The shaver shown in FIG. 1 is provided with a casing 1 and a double shear head 2, in stepped arrangement. In a zone which is within the gripping range of the user, the casing 1 is provided with a conducting contact plate K2 which is electrically connected to one inlet (terminal 56) of the sensor switch 5 (FIG. 2). The other inlet of the sensor switch 5 (terminal 55), as shown in FIG. 2, is connected electrically to the shear faces K1 and shear head 2 with shear foil, so that when placing the shaver onto the zone to be shaved, the skin resistance RH (shown in FIG. 2 in broken lines) of the user is positioned between the terminals 55 and 56 of the sensor switch 5. By this change in resistance, (from an infinite value to the finite value of RH), at the inlet of the sensor switch 5, the sensor switch 5 switches the supply voltage from the accumulator 4 to the terminals 53, 54 to which the relay RL is connected. The sensor switch 5 is supplied with supply voltage by the accumulator 4 via the terminals 51, 52. An example of connection for the sensor switch 5 is shown in FIG. 3.

When the relay RL is supplied with voltage from the accumulator 4 via the sensor switch 5, it closes its operating contact rl, so that the circuit of the motor is closed. The relay RL is released upon dropping of the accumulator voltage below 1.5 V, which automatically protects the accumulator 4 against discharge at a sub-normal level.

When applying an alternating current voltage of about 4 V to the inlet terminals EE of the shaver (from a mains-operated appliance), the accumulator 4 can be charged via a Graetz rectifier (bridge rectifier) 3 and a charging resistance R.

A further operating contact Rl1 of the relay RL is positioned parallel in relation to the charging resistance R so that the accumulator-operated shaver can also be mains-operated via the associated supply mains appliance under elimination of the charging resistance R.

It goes without saying that opto couplers known per se can be used in mains-operated shavers instead of the relay.

In a battery-operated shaver, the accumulator 4 would be replaced by a battery or battery set; the inlet terminals EE, the Graetz rectifier 3 and the charging resistance R including the parallelly positioned operating contact rl1 could be omitted.

In the case of a strictly mains-operated shaver, the accumulator 4, the charging resistance R including the parallelly switched operating contact rl1 and the Graetz rectifier 3 could be omitted. In this case, however, direct current for operation of the sensor switch 5 and the relay RL would have to be supplied.

We claim:

1. In an electric shaver having a casing, a shear head, a driving motor for the knife, and an on-off switch provided in the motor circuit, the improvement comprising an electronic sensor switch (5) which is electrically connected to a contact plate (K2) on the outside of the casing (1) with the gripping zone and to the shear face (K1) of the shear head (2) and shear foil, the terminals (53, 54)) of the sensor switch (5) being connected to the control circuit of an actuating means (RL) for opening and closing the motor circuit.

2. An electric shaver according to claim 1, including a releasing delay for the relay (RL).

3. An electric shaver according to claims 2 or 1, wherein in an accumulator-operated shaver, an operating contact (r 1) of the relay (RL) is positioned parallel in relation to the charging resistance (R) of the accumulator (4).

4. An electric shaver according to claim 1 wherein said actuating means comprises a relay.

* * * * *